United States Patent
Plummer et al.

(10) Patent No.: US 7,749,872 B2
(45) Date of Patent: *Jul. 6, 2010

(54) CRYSTALLINE-TYPE DEVICE AND APPROACH THEREFOR

(75) Inventors: James D. Plummer, Portola Valley, CA (US); Peter B. Griffin, Woodside, CA (US); Jia Feng, Palo Alto, CA (US); Shu-Lu Chen, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/392,261

(22) Filed: Feb. 25, 2009

(65) Prior Publication Data
US 2009/0176353 A1    Jul. 9, 2009

Related U.S. Application Data

(63) Continuation-in-part of application No. 10/590,223, filed as application No. PCT/US2004/008141 on Mar. 17, 2004, now Pat. No. 7,498,243.

(51) Int. Cl.
*H01L 21/20* (2006.01)
(52) U.S. Cl. .......................... 438/479; 117/53
(58) Field of Classification Search ......... 438/478–479, 438/481, 497, 500; 117/37, 40, 49, 53–54
See application file for complete search history.

(56) References Cited

U.S. PATENT DOCUMENTS 6,635,110 B1  10/2003  Luan et al.

6,897,471 B1  5/2005  Soref et al.
6,946,318 B2  9/2005  Wada et al.

(Continued)

FOREIGN PATENT DOCUMENTS

WO   WO2005/094254   10/2005

OTHER PUBLICATIONS

S. Balakumar et al. "Fabrication Aspects of Germanium on Insulator from Sputtered Ge on Si-Substrates." Electrochemical and Solid-State Letters. vol. 9, No. 5, p. G158-G160 (2006).

(Continued)

*Primary Examiner*—Savitri Mulpuri
(74) *Attorney, Agent, or Firm*—Crawford Maunu PLLC

(57) ABSTRACT

Single-crystalline growth is realized using a liquid-phase crystallization approach involving the inhibition of defects typically associated with liquid-phase crystalline growth of lattice mismatched materials. According to one example embodiment, a semiconductor device structure includes a substantially single-crystal region. A liquid-phase material, such as Ge or a semiconductor compound, is crystallized to form the single-crystal region using an approach involving defect inhibition for the promotion of single-crystalline growth. In some instances, this defect inhibition involves the reduction and/or elimination of defects using a relatively small physical opening via which a crystalline growth front propagates. In other instances, this defect inhibition involves causing a change in crystallization front direction relative to a crystallization seed location. The relatively small physical opening and/or the change in crystalline front direction may be implemented, for example, using a material that is substantially unreactive with the liquid-phase material to contain the crystalline growth.

28 Claims, 11 Drawing Sheets

U.S. PATENT DOCUMENTS

| | | |
|---|---|---|
| 7,008,813 B1 | 3/2006 | Lee et al. |
| 2005/0205954 A1 | 9/2005 | King et al. |
| 2006/0099773 A1 | 5/2006 | Maa et al. |
| 2006/0194357 A1 | 8/2006 | Hsu et al. |
| 2006/0194418 A1 | 8/2006 | Lee et al. |

OTHER PUBLICATIONS

R. Balasubramanian et al. "Fluid Motion in the Czochralski Method of Crystal Growth." PCH/PhysicoChemical Hydrodynamics. vol. 5, No. 1, 1984, p. 3-18. Abstract Only.

Y. Ishikawa et al. "Strain-Induced Band Gap Schrinkage in GE Grown on Si Substrate." Applied Physics Letters. vol. 82, No. 13, p. 2044-2046 (Mar. 31, 2003).

O. I. Dosunmu et al. Resonant Cavity Enhanced Ge Photodetectors for 1550 nm Operation on Reflecting Si Subtrates. IEEE Journal of Selected Topics in Quantum Electronics. vo. 10, No. 4, p. 694-701 (Jul.-Aug. 2004).

Y. H. Kuo et al. "Strong quantum-confined Stark effect in germanium quantum-well structures on silicon." Nature. Vo. 437, No. 27, p. 1334-1336 (Oct. 27, 2005).

M. V. Fischetti et al. "Band structure, deformation potentials, and carrier mobility in strained Si, Ge, and SiGe alloys." Journal of Applied Physics. vol. 80, No. 4, p. 2234-2252 (Aug. 15, 1996).

CRYSTALLINE-TYPE DEVICE AND APPROACH THEREFOR

RELATED PATENT DOCUMENTS

This is a continuation-in-part under 35 U.S.C. §120 of U.S. patent application Ser. No. 10/590,223 filed on Aug. 21, 2006 (U.S. Pat. No. 7,498,243) and entitled "Crystalline-Type Device and Approach Therefor;" which is the national stage filing under 35 U.S.C. §371 of International Application No. PCT/US2004/008141 filed on Mar. 17, 2004 (to which priority is claimed).

FEDERALLY-SPONSORED RESEARCH OR DEVELOPMENT

This invention was made with Government support under contract MDA972-00-1-0013 (UCLA sub award 0160-G-BC767) awarded by the Defense Advanced Research Projects Agency. The Government has certain rights in this invention.

FIELD OF THE INVENTION

The present invention is directed to semiconductor devices and, more specifically, to semiconductor devices having crystalline or a crystalline-based material associated with liquid-phase crystalline growth.

BACKGROUND

Over the years, semiconductor devices have been developed in various forms and using a variety of different materials. A more common and conventional semiconductor device uses silicon (Si) as the main foundational material. As will be discussed further below, semiconductor-device research has explored the benefits of materials amenable to liquid-phase crystalline growth such as germanium-based (germanium-including) materials.

In silicon-based semiconductor devices, active devices are typically formed in the surface region of the bulk silicon substrate. In some instances, an epitaxially grown Si layer may be formed over a bulk Si substrate and active devices are formed in the epitaxially grown layer. In such conventional applications, significant capacitance is generally present across a device junction that exists in the bulk silicon substrate or in the overlying epitaxially grown layers. This capacitance tends to slow down the switching speed of circuitry.

One semiconductor application that has been implemented with silicon to reduce the capacitance associated with a bulk silicon junction involves the use of an insulative layer (e.g., oxide) to separate epitaxial silicon from bulk silicon and is commonly referred to as a silicon-on-insulator (SOI) structure. In an SOI structure, the insulator layer greatly reduces the device junction capacitances. The relatively reduced capacitance associated with SOI applications is beneficial for increasing switching speed in switching applications (e.g., transistors), where capacitance delays device switching.

While SOI structures have been found useful in reducing the capacitance typically associated with conventional silicon applications, the epitaxial silicon in the SOI structure exhibits relatively low carrier mobility. Germanium is an example material that can be a desirable alternative to silicon for a variety of applications, largely because germanium exhibits a carrier mobility that is very high relative to that in silicon. For instance, germanium is a promising channel material for MOS-type transistors due to this high carrier mobility. Germanium also has other material properties that differ from silicon, such as a smaller bandgap. These properties facilitate optoelectronic devices and many additional device options. In the past few decades, the use of germanium as well as other materials for integrated circuit applications have been investigated and implemented due to their enhanced qualities, relative to other types of semiconductor materials such as silicon.

The use of semiconducting materials such as germanium-type materials with an implementation similar to SOI (i.e., germanium-on-insulator (GeOI)) would accordingly be useful to achieve relatively low leakage current together with high performance associated with a low-capacitance interface with the insulator layer, similar to that exhibited with SOI.

Single-crystal materials are desirable for use in active regions due to their characteristics relative to, for example, polycrystalline materials. However, single-crystal materials, such as germanium, are difficult to manufacture. In addition, when germanium is grown by epitaxy methods at a seed interface that includes silicon, a lattice mismatch (e.g., about 4%) between the germanium and silicon can result in defects that propagate from this seed interface. This lattice mismatch typically exists between any two different types of crystalline materials. Other approaches to forming single-crystalline materials, such as those using separation by implanted oxygen (SIMOX), wafer bonding, chemical vapor deposition (CVD) epitaxial overgrowth and solid-phase epitaxial growth (SPE) have been relatively complex and difficult to use.

The above and other difficulties have been challenging to the implementation of single-crystal-based materials in a variety of semiconductor applications.

SUMMARY

The present invention is directed to the above and related types of circuit devices and their manufacture in which structures having a crystalline-based material that includes substantially epitaxial crystalline material. In connection with one aspect of the present invention, it has been discovered that relatively rapid growth of single-crystalline material can be achieved with a liquid phase epitaxy (LPE) approach with relatively dominating epitaxial growth. This epitaxial approach is implemented to achieve a substantially single-crystal, defect-free material that can be implemented in a multitude of applications. The present invention is exemplified in a number of implementations and applications, some of which are summarized below.

In one example embodiment of the present invention, a relatively unreactive (e.g., inert) material is used to contain a liquid-phase material during epitaxial growth. The unreactive material has a physical orientation that directs the growth of the single-crystalline material to mitigate defects in the epitaxially grown crystalline structure.

In another embodiment, the unreactive material is formed over a substrate that is conducive to the initiation of crystalline growth of the liquid phase material upon cooling. The substrate and the unreactive material have generally higher melting points than the liquid-phase material, thus facilitating the containment of the liquid phase material during heating (liquefying) and cooling (crystallization). After heating, the liquid-phase material is cooled and crystalline growth is initiated near an interface between the liquid-phase material and the substrate. Initial crystallization is characterized by defects generally associated with a crystalline lattice mismatch between the substrate and the liquid phase material. The unreactive material is physically arranged to inhibit defects and promote single-crystalline growth upon crystallization of the liquid-phase material. For example, the unreactive material can be arranged such that the propagation front of the crystalline growth passes through a relatively narrow region. This relatively narrow region is used to inhibit the propagation of defects including those associated with the lattice mismatch.

In another example embodiment of the present invention, single-crystal material is formed using a change in propagation direction of a crystalline growth front thereof to mitigate defects and promote single-crystal growth. In a more specific application, this change in propagation direction of the growth front results in a substantial narrowing (or "necking") of crystalline growth characterized by defects (due e.g., to a lattice mismatch between the crystalline structure being grown and a material at which the growth initiates). In this regard, a seeding location for the initiation of crystalline growth is formed adjacent to a geometrical boundary that causes the change in propagation direction. Crystalline growth is initiated (i.e., upon cooling of liquid-phase material) at the seed location and propagates away from the seed location. Defects and/or undesirable growth such as mismatch-type defects typically characterize this initial crystalline growth. Upon reaching the boundary, the propagation changes in direction and, correspondingly, undesirable and/or defect-related crystalline growth associated with the seed location is inhibited or even eliminated. Subsequent propagation of the crystalline front in a direction away from the geometrical boundary is substantially single-crystal growth.

According to another example embodiment of the present invention, a semiconductor electronics device includes a substantially single-crystal material having a composition that is preponderantly epitaxially grown. The single-crystal material is formed, for example, using liquid phase epitaxy in a manner that rapidly generates single-crystal growth that dominates growth attributable to random nucleation. With this approach, a relatively high-quality epitaxial material is grown.

In another example embodiment of the present invention, the single-crystal material is part of a capacitive-type structure with an inert-type layer disposed immediately adjacent the single-crystal material. Such a structure may be implemented, for example, in connection with common germanium-on-insulator (GeOI) type applications with the single-crystal material including single-crystal germanium.

According to other aspects of the present invention, various embodiments are directed to a single-crystal-based material grown using a LPE approach involving a micro-crucible delivery of a liquid used to form the single-crystal-based material. In some instances, these and other embodiments are also directed to approaches for patterning an inert-type layer as well as material to be liquefied and used to form various single crystalline-based devices.

Aspects of the present invention are directed to a method for manufacturing a semiconductor device. A liquid-phase material (that includes a compound of at least two materials, e.g., congruently melting materials) is introduced to an inert-type material. A single-crystal is epitaxially grown, from a substrate and from the liquid-phase material, over the inert-type material. A semiconductor-on-insulator structure is formed that includes the crystalline structure and the inert-type material.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIGS. 2A-2F show cross-sectional views of a portion of a semiconductor device at various stages of manufacture, according to another example embodiment of the present invention in which:

FIG. 2A shows a semiconductor device including a silicon substrate with an inert-type layer formed thereon;

FIG. 2B shows the device of FIG. 2A with the inert-type layer patterned to form openings extending down to the silicon substrate;

FIG. 2C shows the device of FIG. 2B having a germanium layer formed over the inert-type layer and on the silicon substrate at the openings in the inert-type layer;

FIG. 2D shows the device of FIG. 2C with the germanium layer patterned to form germanium device locations on the substrate;

FIG. 2E shows the device of FIG. 2D with another inert-type material formed over the patterned germanium layer, the inert-type layer and the silicon substrate; and FIG. 2F shows the device of FIG. 2E having undergone melting and crystallization of the germanium layer with arrows showing progression of the crystallization front;

Figure 1A:
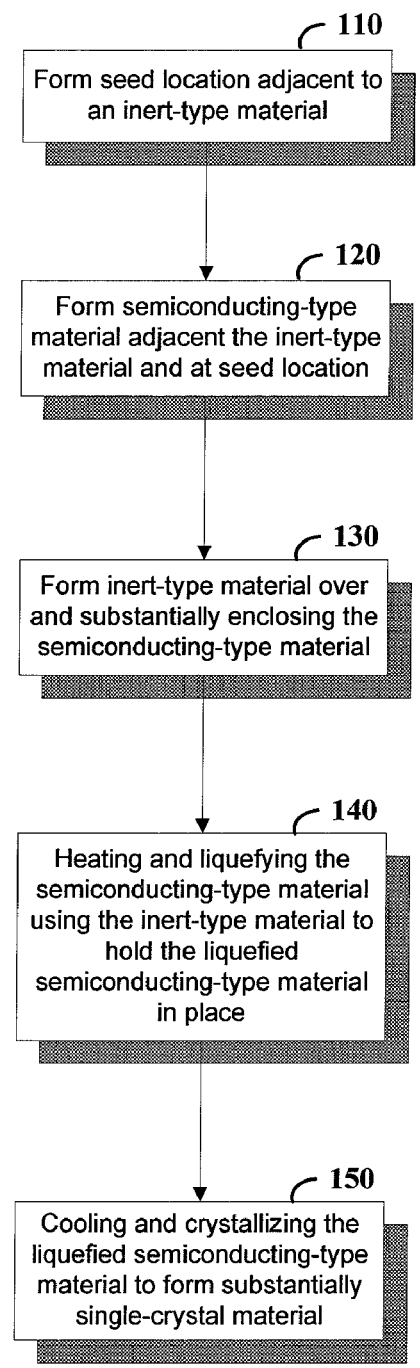
FIG. 1A is a flow diagram for growing relatively defect-free crystalline material, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of applications benefiting from single-crystalline-type structures, and has been found to be particularly useful for semiconductor circuits employing single-crystalline substrate materials and the manufacture thereof. While the present invention is not necessarily limited to such approaches, various aspects of the invention may be appreciated through a discussion of various examples using this context.

According to an example embodiment, the present invention is directed to the manufacture of a semiconductor device using an inert material to epitaxially grow a single-crystalline material from a liquid-phase material. This growth occurs while using a physical orientation of the inert material to direct the growth of the single-crystalline material without typically-expected defects in the epitaxially grown crystalline structure.

According to another example embodiment, substantially single-crystal material is grown over a substrate using liquid-phase epitaxy while mitigating defects therein. Crystalline growth is initiated with a liquid-phase material near a seed location from which a crystallization front propagates. Defects typically associated with the seed location (e.g., due to a lattice mismatch between the liquid-phase material and the substrate) that characterize the initial crystalline growth are mitigated (e.g., reduced or eliminated) using a defect-necking approach. In some instances, this defect-necking approach involves the promotion of a crystalline growth front propagation through a relatively narrow aperture that mitigates the tendency of defects such as dislocations or stacking faults from characterizing the crystalline growth. In other instances, the defect-necking approach involves the promotion of a change in direction of the propagation front of the crystalline growth, the change in direction similarly mitigating defects.

In one implementation, an inert-type material (i.e., material that is substantially unreactive with the liquid-phase material) is used to contain the liquid-phase material and promote the defect-necking approach discussed above. The inert-type material and the substrate have a high melting point, relative to the melting point of the liquid-phase material. In addition, the inert-type material is physically arranged to promote the above-discussed necking of defects that form as the liquid-phase material crystallizes. For instance, the inert-type material may be arranged having a relatively small cross-section through which the propagation front passes or having a shape that forces the propagation front to change direction as the liquid phase material crystallizes. In some instances, defects are mitigated using the physical arrangement of the inert type material to promote defect necking via mechanisms similar to those characterizing Czochralski-type crystalline growth. For general information regarding Czochralski-type crystalline growth and for specific information regarding growth mechanisms that can be implemented in connection with one or more of the example embodiments discussed herein, reference may be made to Balasubramaniam, R. and Ostrach, S., "Fluid Motion in the Czochralski Method of Crystal Growth," PCH PhysicoChemical Hydrodynamics, Pergamon Press Ltd, Great Britain, Vol. 5(1), pp. 3-18, 1984, which is fully incorporated herein.

It should be apparent that it is possible to generate crystalline growth in the liquid phase change material without fully melting the material. For instance, heating the liquid phase change material near the melting point can be sufficient to produce a crystalline growth front upon cooling of the material. Thus, certain embodiments involve heating the liquid phase change material to a semi-solid state that is sufficient to produce a crystalline growth front upon cooling.

According to another example embodiment of the present invention, a semiconductor device includes a germanium-based material (i.e., germanium-including material) that is substantially single-crystal germanium formed using a liquid-phase epitaxy approach over an inert-type substrate material. In connection with this example embodiment, it has been discovered that epitaxial growth of single-crystal germanium is much faster than random nucleation associated with germanium crystallization. In this regard, epitaxial growth of the germanium-based material is initiated using a seed location that is conducive to germanium crystallization and from which a germanium crystallization front emanates. Near the seed location, a defect-necking type approach such as that discussed above is used to substantially inhibit the growth of defects characteristic of growth at the seed location, with subsequent growth being substantially single-crystal germanium growth.

In another example embodiment of the present invention, an inert-type layer such as silicon nitride is formed on a silicon substrate (e.g., (100) silicon) and subsequently patterned to form openings that extend down to the silicon substrate. A layer of germanium-containing material is then formed over the inert-type layer and in the patterned openings, filling the openings and forming silicon-germanium seed locations at the silicon substrate exposed by the patterning of the inert-type layer. The germanium-containing layer is then patterned to form germanium-crystallization regions, each region including at least one seed location.

In one implementation, another layer of inert-type material is then formed over the patterned germanium-crystallization regions and, with the inert-type layer and silicon at the openings therein, forming an enclosure around the patterned germanium-crystallization regions. The inert-type material is selected to be relatively inert (e.g., non-reactive) with the germanium-containing material and further having a melting point that is higher than the germanium-containing material. In another implementation, the layer of inert-type material is not used over the germanium-containing material with the germanium-containing material being either bounded (e.g., on its sides) by inert-type or other material and/or the germanium-containing material being substantially unbounded.

After the inert-type material is in place (if used), the germanium-crystallization regions are heated and liquefied under conditions that leave the inert-type material (if used) substantially intact and holding the liquefied germanium-containing material in place. The liquefied germanium-crystallization regions are then cooled and crystallized. The crystallization begins at the germanium-silicon seed location(s) and includes, for example, single-crystal and/or polycrystalline germanium growing in a generally upward direction limited by the patterned openings in the inert-type layer, with "upward" being relative to the view. As the crystallization front progresses and reaches an upper portion of the liquefied germanium, the crystallization front changes direction from the generally upward direction to a generally lateral direction. When an inert-type material is used as an upper bound of the liquefied germanium, this change in direction occurs when the crystallization front reaches the upper portion of the inert-type material. Upon the change in direction, defective-type crystallization growth associated with the crystalline seed location is substantially inhibited, with the progressing growth in the generally lateral direction being substantially single-crystal germanium.

After the germanium crystallization regions are cooled and crystallized, the inert-type layer can be removed (if used), leaving behind patterned crystallized germanium regions having single-crystal germanium regions where the lateral crystalline growth occurred. The single-crystal germanium regions are then used to form devices including, for example, active regions used for current switching and other purposes. For instance, when the inert-type layer formed on the substrate is an insulative layer and the resulting single-crystal germanium regions are located over the insulative layer, a germanium-on-insulator (GeOI) arrangement is formed and can be used to form transistors having a substantially single-crystal germanium channel region. With this approach, a multitude of circuit applications involving single-crystal germanium can be realized, with the patterning approaches discussed herein being used for placement thereof.

Various example embodiments of the present invention are directed to the crystallization of a liquid-phase material over a substrate using an inert-type material to contain the liquid-phase material and inhibit defects to promote single-crystalline growth. The relationship between the substrate, the inert-type material and liquid-phase material is such that the liquid phase material has a generally lower melting point than substrate and the inert-type material. In addition, the inert-type material is generally unreactive with the liquid-phase material (and/or a crystalline form thereof), and may include conductive and/or insulative material. Furthermore, the substrate is generally conducive to the formation of a crystalline seed location near an interface between the substrate and the liquid-phase material. By way of example, certain discussion is directed to specific examples involving particular types of materials used for the substrate, liquid-phase material and inert-type material. For instance, many examples discuss an approach to growing single-crystal germanium and a GeOI structure. However, these and other example embodiments are readily applicable to a variety of types of materials, including those exhibiting the relationships discussed above between the substrate, inert-type material in liquid-phase material. For instance, semiconducting and conducting materials other than germanium amenable to epitaxial growth (e.g., Gallium-containing materials and other III-V semiconductor type materials) may be implemented in connection with the germanium-based examples.

Surprisingly, high quality crystalline compound material (e.g., GaAs) on insulator on bulk Si substrates can be formed by efficient deposition and heating using a micro-crucible melt regrowth technique. According to one embodiment, the technique includes deposition of an amorphous compound material (e.g., GaAs) stripe that contacts a seed window in the silicon substrate. The deposited stripe is encapsulated by a deposited layer that acts as a micro-crucible. The deposited stripe is then melted it to allow epitaxy to occur. Defects are terminated in the seed window and a single crystal stripe is created.

Turning now to the figures, FIG. 1A is a flow diagram for growing substantially single-crystalline material, according to another example embodiment of the present invention. At block 110, a seed location is formed adjacent to an inert-type layer of material formed on a seeding substrate (e.g., a silicon wafer). This seed location may be formed, for example, by creating an opening in the layer of inert-type material to expose a portion of the seeding substrate. Alternatively, the seeding substrate is deposited and/or grown adjacent to the inert-type material, which can be implemented in the form of a layer as discussed above or otherwise implemented to suit the particular application. The inert-type material is selected to be relatively inactive with, as well as to have a higher melting point than, the single-crystalline material.

At block 120, a semiconducting-type material is formed adjacent the inert-type material and in contact with the seed location. Inert-type material is also formed over and substantially enclosing the semiconducting-type material at block 130 (i.e., with the semiconducting-type material being bound by the inert-type material and the seeding substrate). At block 140, the semiconducting-type material is heated and liquefied using approaches such as furnace annealing, laser annealing, flash annealing or rapid thermal annealing (RTA). The inert-type material holds the liquid semiconducting-type material in place, effectively forming micro-crucibles of liquid-phase semiconducting-type material, the micro-crucibles being relatively small and, in some instances, having nanometer-scale dimensions. In this regard, nano-scale micro-crucibles can be implemented for forming nanowires and other nano-scale devices. At block 150, the liquefied semiconducting-type material is cooled and crystallized, with a crystallization front beginning at and extending from the seed location in a first direction.

As discussed above, defects typically associated with the crystallization of the liquefied semiconducting-type material emanate from the seed location. These defects are mitigated via the arrangement of the inert-type material, using a necking type approach as discussed above. In one instance, upon reaching the inert-type material, the direction of the crystalline front is changed, which substantially promotes the growth of substantially single-crystal material after the change in front direction. The growth of single-crystalline material continues to propagate in the changed direction during cooling, creating a single-crystalline region that can be used to form one or more of a variety of semiconductor devices. In another instance, the inert-type material has a cross-section through which the crystalline growth front propagates that is sufficiently small to inhibit the continued growth of defects.

The approach to forming single-crystal material discussed in connection with FIG. 1A can be implemented using many different arrangements and processing parameters in manners generally consistent with the above approach. In addition, many different types of semiconductor devices in a variety of arrangements can be manufactured using the approach discussed above. In this regard, the available material, available manufacturing equipment, type of device using the single-crystal material and arrangement of devices on a common substrate on which the single-crystal material is formed can be taken into consideration when implementing the approach shown in FIG. 1A.

One particular example approach for liquefying and crystallizing germanium as applicable to the above-discussed approaches is as follows. A silicon nitride insulative material is deposited on top of a (100) silicon wafer, with seeding windows patterned in the insulative material to expose the silicon wafer. Germanium is sputtered non-selectively onto the silicon nitride and exposed portions of the silicon wafer. The germanium is then patterned, followed by a conformal low-temperature oxide (LTO) deposition using low pressure CVD (LPCVD). The germanium is then heated in an RTA chamber in which it is brought up to about 940 degrees Celsius for about 2 seconds. The silicon wafer is then cooled down naturally in the RTA chamber, taking about 10 seconds to reach a temperature of about 400 degrees Celsius. Alternately, the silicon wafer cooling rate can be controlled via one or more of a variety of cooling techniques, such as the use of air, cooling (i.e., refrigerating) devices and others, as slowed using a variety of heating approaches. During the cooling, liquid-phase epitaxy of the liquefied germanium occurs, with a growth front starting from silicon-germanium interfaces at the seeding windows and propagating laterally through the liquefied germanium on the silicon nitride.

Figure 1B:
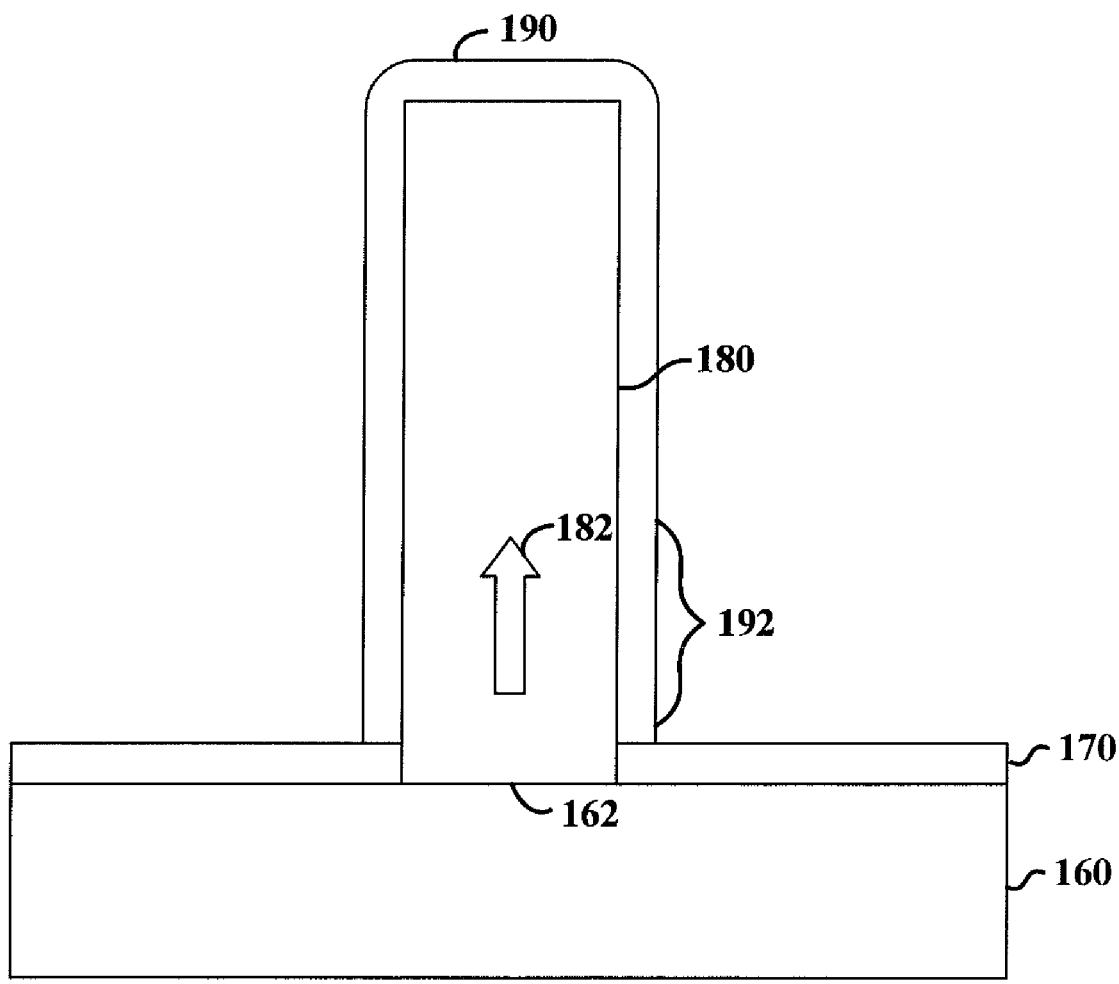
FIG. 1B shows a structure and approach for growing relatively defect-free crystalline material, according to another example embodiment of the present invention.

FIG. 1B shows a cross-sectional view of a structure and approach for growing relatively defect-free crystalline material, according to another example embodiment of the present invention. The approach shown in FIG. 1B can be implemented, for example, in connection with the approach shown in FIG. 1A. A layer 170 of inert-type material is formed over a seeding substrate 160. An opening is formed in the layer 170 to expose the seeding substrate 160 and a semiconducting-type material 180 is formed at a seeding location 162 in the opening, adjacent to the layer 170 and on the seeding substrate 160. Additional inert-type material 190 is formed to enclose the semiconducting material 180. The semiconducting material 180 is heated, liquefied and cooled to initiate crystalline growth at the seeding location 162. Growth propagates in a direction represented by the arrow 182, with defects initiating at the seeding location 162 being reduced and/or eliminated as the crystalline growth front propagates through a cross-sectional portion 192 of the inert material 190. This defect reduction (i.e., necking) at cross-section 192 is facilitated via the size of the cross-section and characteristics of the crystalline growth, with the cross-section being implemented to achieve the defect reduction relative to the type of material being crystallized.

FIGS. 2A-2F show cross-sectional views of a portion of a semiconductor device 200 at various stages of manufacture, according to another example embodiment of the present invention. Beginning with FIG. 2A, a silicon-based substrate 205 (e.g., silicon including substrate such as bulk silicon and/or SOI type substrates common to semiconductor wafers) is used as a base and a relatively thin layer 210 of inert-type material is formed over the silicon substrate 205. The inert-type layer 210 may include, for example, one or more of a variety of materials compatible with the particular type of crystalline growth, including conducting and insulating materials such as nitrides, oxides, metals and others. Furthermore, the inert-type layer 210 can be grown and/or deposited, depending upon the application and available material.

Figure 2A:
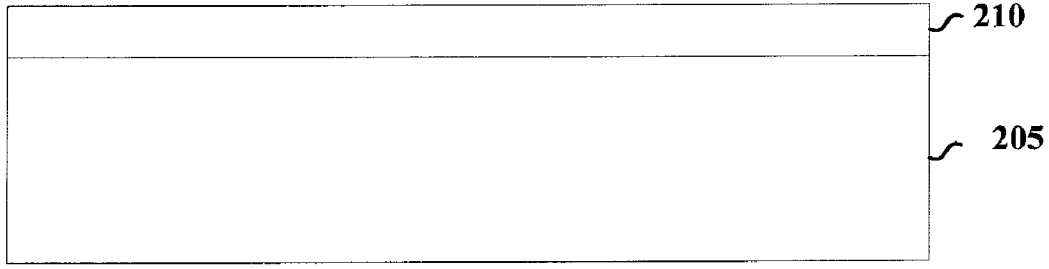
Figure 2B:
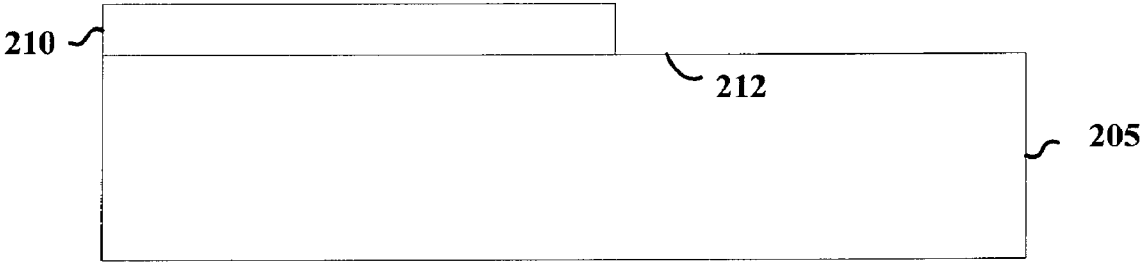

In FIG. 2B, the inert-type layer 210 has been patterned to expose a portion of the silicon substrate 205. The shape of the pattern and resultant shape of the inert-type layer 210 can vary by some degree and further can be selected to effect a particular geometry for end-use implementations of the single crystal germanium to be formed as discussed below. In some instances the inert-type layer 210 is patterned such that an array of small openings in the inert-type layer expose the silicon substrate 205, each opening forming a seed region for initiating crystalline germanium growth. In this instance, the patterning of the inert-type layer 210 has exposed a seed region 212 immediately adjacent the remaining portion of the inert-type layer.

In one implementation, a thin silicon layer is formed at the top portion of the inert-type layer 210 to facilitate the coverage of germanium subsequently formed as discussed below in connection with FIG. 2C. This thin silicon layer has a thickness selected to fit the particular implementation to which it is applied to facilitate, for example, germanium coverage while exhibiting relatively little to no defects near the interface between the germanium layer 220 and the thin silicon layer. For example, a thin amorphous silicon layer having a thickness sufficiently small (e.g., less than about 5 nanometers) so as to generally not affect the crystalline germanium growth can be implemented over the inert-type layer 210 to facilitate the coverage of germanium. Other thin layers such as sputtered germanium that promote the coverage of germanium as it is formed on the patterned inert-type layer 210 can also be used.

Figure 2C:
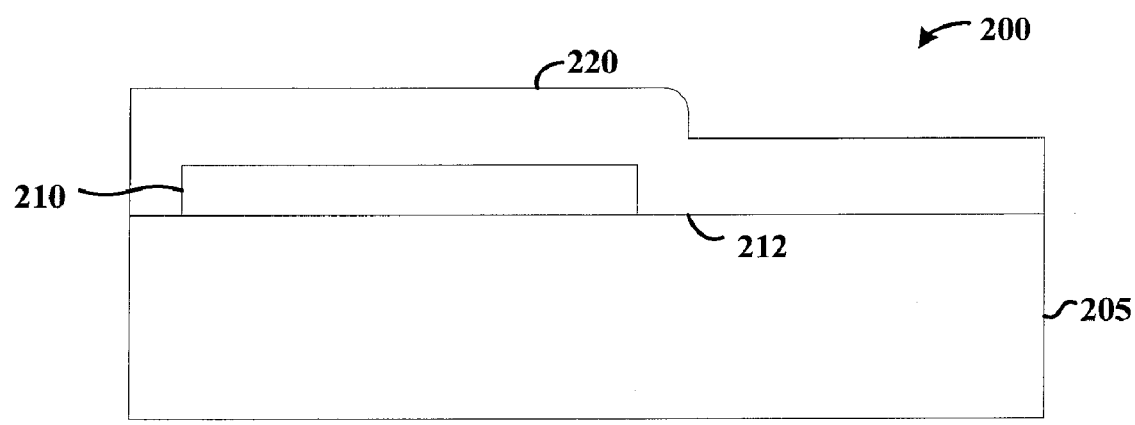

FIG. 2C shows a germanium-containing layer 220 having been formed over the patterned inert-type layer 210 and the silicon substrate 205. The germanium-containing layer 220 includes germanium material such as amorphous germanium, polycrystalline germanium, silicon germanium and doped germanium (e.g., doped with boron, phosphorous, antimony, arsenic, another suitable dopant, or a combination thereof). In addition, the germanium-containing layer 220 can be formed using one or more of a variety of approaches, such as chemical vapor deposition (CVD), physical vapor deposition (PVD), sputtering, selective deposition, a Damascene approach or spin-on coating. The germanium layer 220 is then patterned to form one or more germanium device locations on the inert-type layer 210 as shown in FIG. 2D, with a small portion of the germanium layer 220 forming a silicon-germanium interface with the silicon substrate 205 at seed location 212.

Figure 2D:
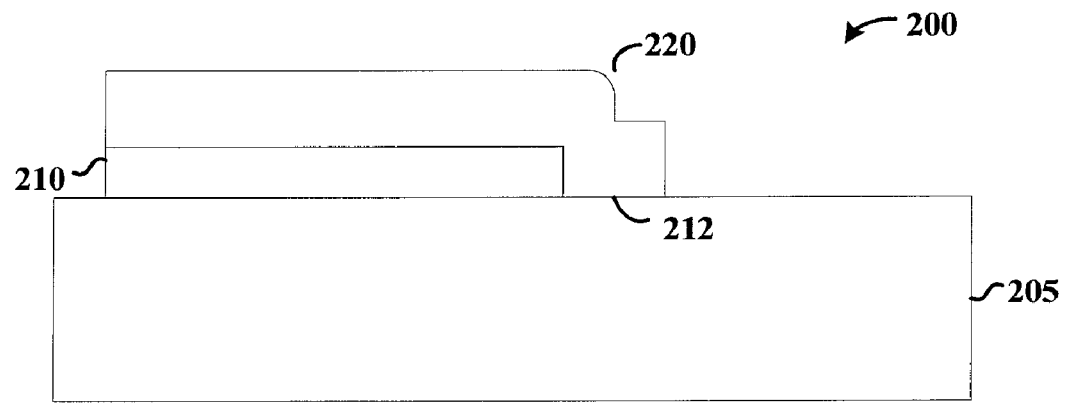

In one instance, the germanium layer 220 and the underlying inert-type layer 210 are patterned in a single step, such that sidewalls of the patterned germanium-layer are aligned with sidewalls of the inert-type layer as shown, for example, at the left region of the device 200 in FIG. 2D. This approach facilitates the formation of devices adjacent to devices using the patterned germanium and directly on the silicon substrate 205. For instance, where a silicon-based device is to be formed on the substrate 205 laterally adjacent to the patterned germanium-containing layer 220 and inert-type layer 210, the removal of the underlying inert-type layer 210 during the germanium patterning may be desirable.

In other instances where adjacent devices employ an insulator layer, such as a silicon-on-insulator (SOI) device, the insulator layer 210 is optionally left extending well beyond the lateral bounds of the patterned germanium layer 220 so that the adjacent devices can use the same insulator layer. After patterning of the germanium layer 220, semiconductor material (e.g., epitaxial silicon for a SOI device) is grown and/or deposited on the insulator layer 210 and laterally adjacent the germanium layer 220. Alternatively, the germanium layer 220 is formed and patterned after the formation of the adjacent device (e.g., after epitaxial growth/etching of silicon for SOI structure).

Figure 2E:
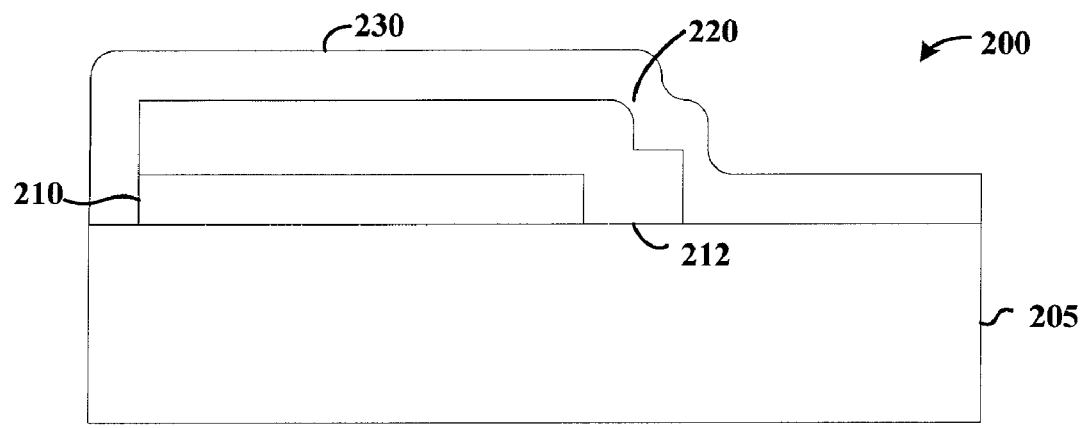
Figure 2F:
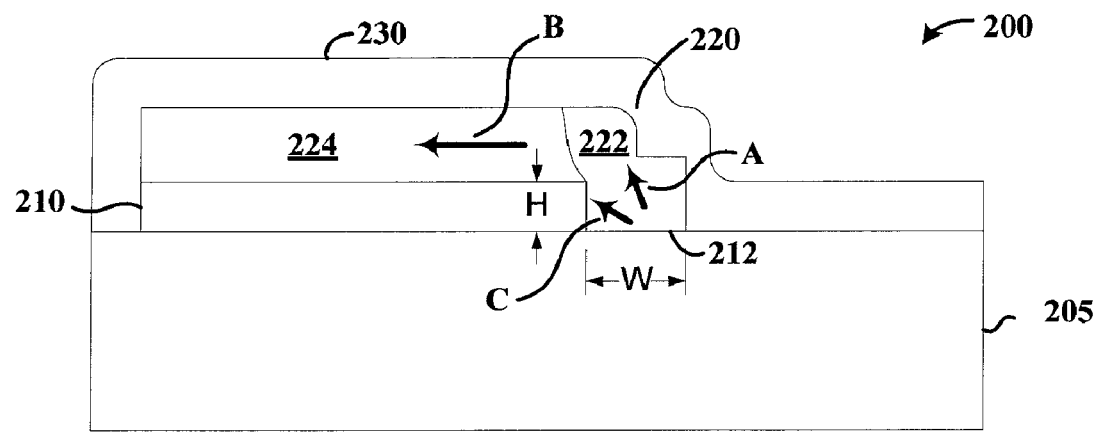

Referring now to FIG. 2E, an inert-type layer 230 is shown having been formed over and on sidewalls of the patterned germanium layer 220, the inert-type layer 210 and the silicon substrate 205. The inert-type layer includes material, such as silicon oxide or silicon nitride, that has a higher melting point than the germanium layer 220 and is relatively inactive with the germanium layer 220. The germanium layer 220 is then liquefied and crystallized as shown in FIG. 2F, with arrows showing progression of a crystallization front that begins at the seed location 212. Liquefying the germanium layer 220 is achieved using one or more of the approaches discussed above and may involve, for example, placing the device 200 in a furnace chamber or other heating device commonly used in semiconductor fabrication. The inert-type layer 230 remains intact while the germanium layer 220 is in liquid phase such that the liquefied germanium is substantially held in place (i.e., does not flow).

The crystallization front extends generally upward from the seed location 212 (as shown by arrow "A" pointing upward) until it reaches an upper bound at the inert-type layer 230. This first crystallization stage results in the formation of crystalline germanium 222 having defect characteristics typically associated with crystalline lattice mismatch exhibited between the silicon substrate 205 and the germanium layer 220. Mismatch between the crystalline structure of silicon and germanium is typically about 4%, causing defects as growth propagates from a silicon-germanium interface. For instance, threading dislocations and stacking faults can grow from the seed location 212 in an upward direction as shown by the arrow. Upon reaching the inert-type layer 220, these and other defects are terminated as the crystallization front changes direction to a generally lateral direction as shown by horizontal arrow "B." In this second crystallization stage (after the change in direction of the front), crystalline germanium 224 is substantially all single-crystal germanium (e.g., (100) and/or (111) germanium using corresponding (100) and/or (111) silicon seed locations).

The orientations and corresponding propagation directions of the crystalline fronts as shown in and discussed in connection with FIGS. 2A-2F are shown by way of example, with a variety of different arrangements and orientations being applicable to the example approaches and implementations discussed above. For instance, the inert-type layer 210, germanium layer 220 and inert-type layer 230 can be formed in an arrangement wherein a first stage crystalline germanium growth is in a horizontal direction with a subsequent change to a vertical direction for a second stage (primarily single-crystal) germanium growth. In these and other implementations, the change in propagation direction of the crystalline growth front is selected to be sufficient to inhibit defect-type growth associated with the first stage discussed above and to promote single crystal growth associated with the second stage.

In one particular implementation, the arrangement of the inert-type layer 210, germanium layer 220 and inert-type layer 230 are selected as a function of characteristics that affect the angle of propagation of the crystallization front. For instance, the angle of crystallization front propagation angle is affected by the lattice mismatch between the germanium layer 220 and the silicon substrate 205. In this regard, a relatively low propagation angle during the first stage as shown by arrow "C" can be inhibited by a relatively deep seeding location. Referring to the dimensions "H" (height) and "W" (width) of the seeding location, these dimensions can be selected as a function of the propagation angle (relative to the silicon substrate 205) to ensure a sufficient change in direction of the propagation front. As the propagation angle decreases (i.e., becomes more horizontal), the height "H" is correspondingly increased to reduce the length that the front may travel over the inert-type layer 210. As shown with arrow "C," a sidewall of the inert-type layer causes a change in direction of the portion of the crystallization front extending as shown.

Figure 3:
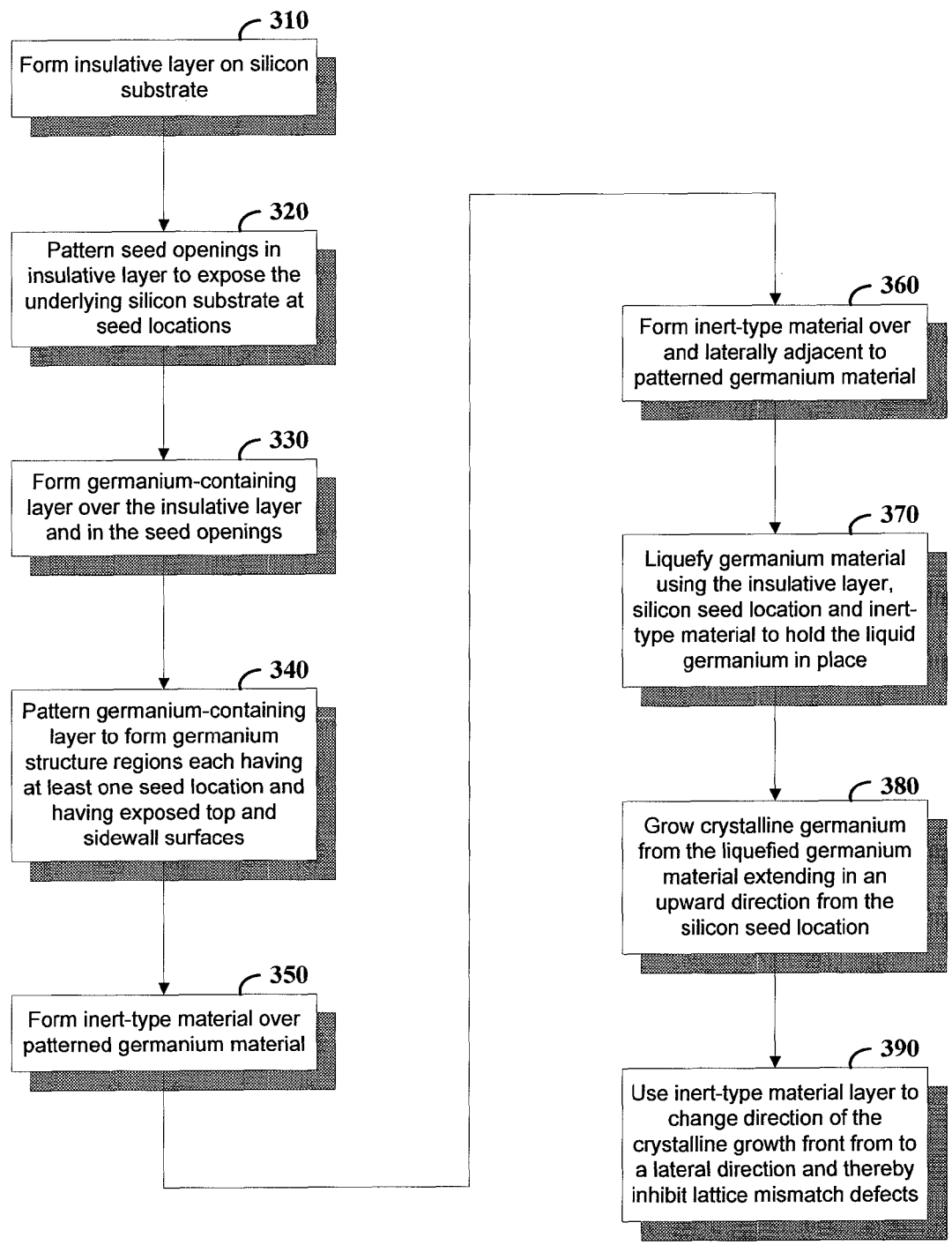
FIG. 3 is a flow diagram for an approach to growing a germanium-based material using patterned seed locations, according to another example embodiment of the present invention.

FIG. 3 is a flow diagram for an approach to growing a germanium-based material using patterned seed locations, according to another example embodiment of the present invention. The approach shown in FIG. 3 can be applied, for example, to a process represented by the various stages of manufacture shown in FIGS. 2A-2F. Beginning at block 310, an inert-type layer is formed on a silicon substrate and seed openings are patterned in the inert-type layer to expose underlying silicon substrate at block 320.

After the inert-type layer is patterned, a germanium-containing layer is formed over the inert-type layer and on the silicon substrate in the seed openings at block 330. At block 340, the germanium-containing layer is patterned to form germanium structure regions, with each region having at least one seed location. Referring to FIG. 2D as an example, a multitude of germanium structure regions can be formed in the manner shown with the patterned germanium layer 220 and seed location 212.

An inert-type material is formed over and laterally adjacent to the patterned germanium-containing layer at block 360, substantially enclosing exposed portions of the germanium-containing layer. The liquefaction is achieved using one or more of a variety of approaches discussed above and otherwise. The inert-type material is then used as an upper and sidewall boundary, with the inert-type layer and the seed location further serving as lower and sidewall boundaries, to contain the germanium-containing layer as it is liquefied at block 370.

At block 380, the liquefied germanium is allowed to cool, with a simple removal of the source used to liquefy the germanium and/or with a cooling process. As the liquefied germanium cools, it begins to crystallize at the seed location with a crystallization front propagating in a generally upward direction from the seed location. This initial crystallization front propagating from the seed location involves the formation of defects such as lattice mismatch defects that occur due to a lattice mismatch between the liquefied germanium and the silicon substrate. These defects are undesirable for implementation in semiconductor device applications including, for example, channel regions that typically benefit from single-crystal structures.

The lattice mismatch defects are inhibited using a change in direction of the crystallization front. Specifically, the inert-type material is used at block 390 to change the generally upward propagation direction to a more lateral direction. This change in crystallization front direction causes a change in the type of crystalline growth, substantially inhibiting the formation of the lattice mismatch defects in the crystalline structure. After the change in propagation direction of the crystalline front, the cooling and crystallization of the liquefied germanium forms a crystalline germanium structure that is substantially single-crystal germanium. Once the liquefied germanium has been crystallized, the structure is ready for implementation in a variety of applications, such as use as an active region or a channel region for a switching circuit (e.g., a transistor).

Figure 4A:
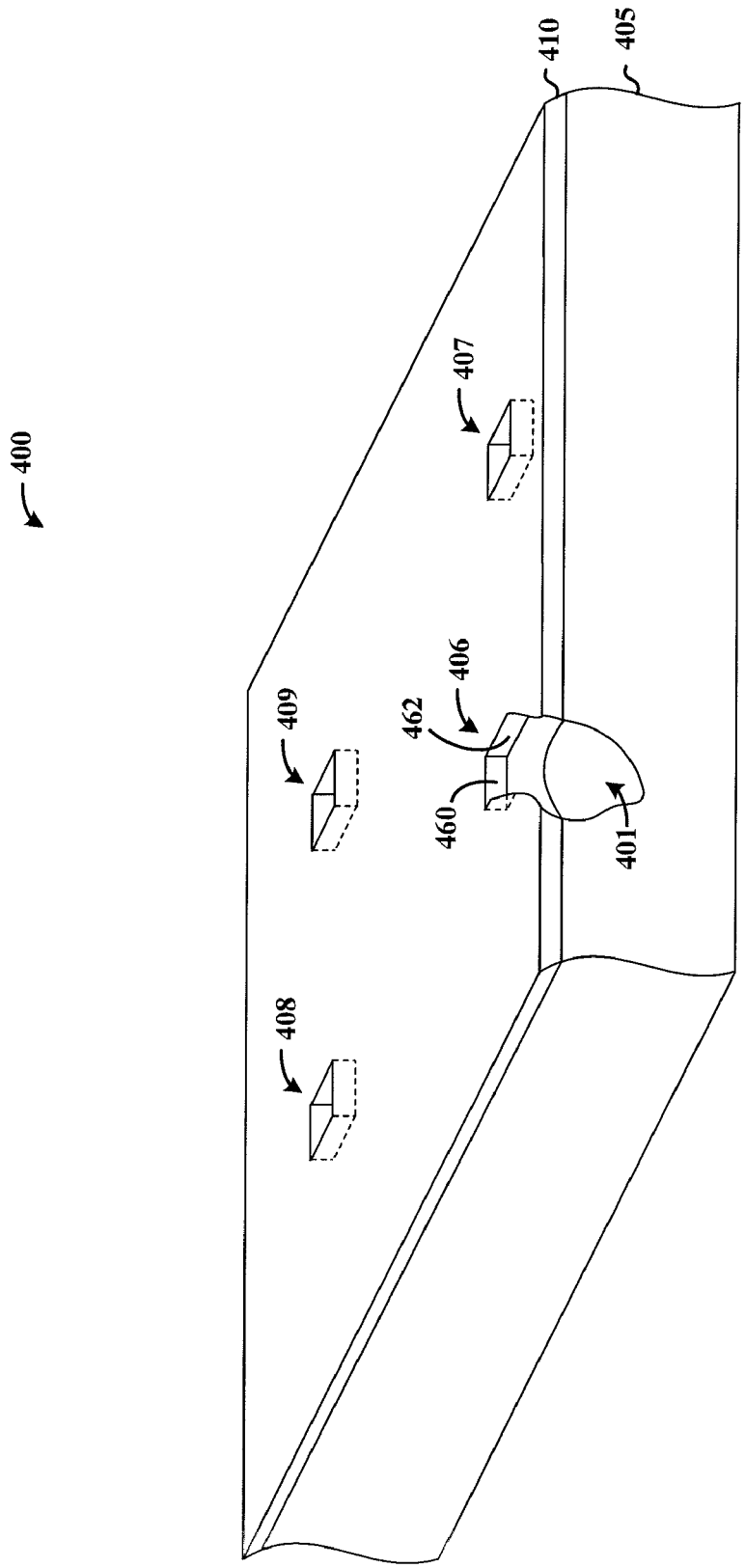
FIG. 4A is a cross-sectional, cut-out view of a silicon wafer coated with an inert-type layer having an array of seed openings patterned therein, according to another example embodiment of the present invention.

FIG. 4A shows cross-sectional, cut-out view of a silicon wafer 400 coated with an inert-type layer 410 having an array of seed openings 406, 407, 408 and 409 patterned therein, according to another example embodiment of the present invention. The device 400 can be implemented using, for example, one of the germanium crystallization approaches discussed above with the seed openings 406-409 being used to initiate the crystallization of liquefied germanium. Referring to cutout portion 401, seed opening 406 includes a generally rectangular opening extending down to the inert-type layer 410, with sidewalls including exposed sidewalls 460 and 462. In one implementation, the device 400 is used to form Silicon-based devices adjacent germanium devices employing the seed openings 406-409.

Figure 4B:
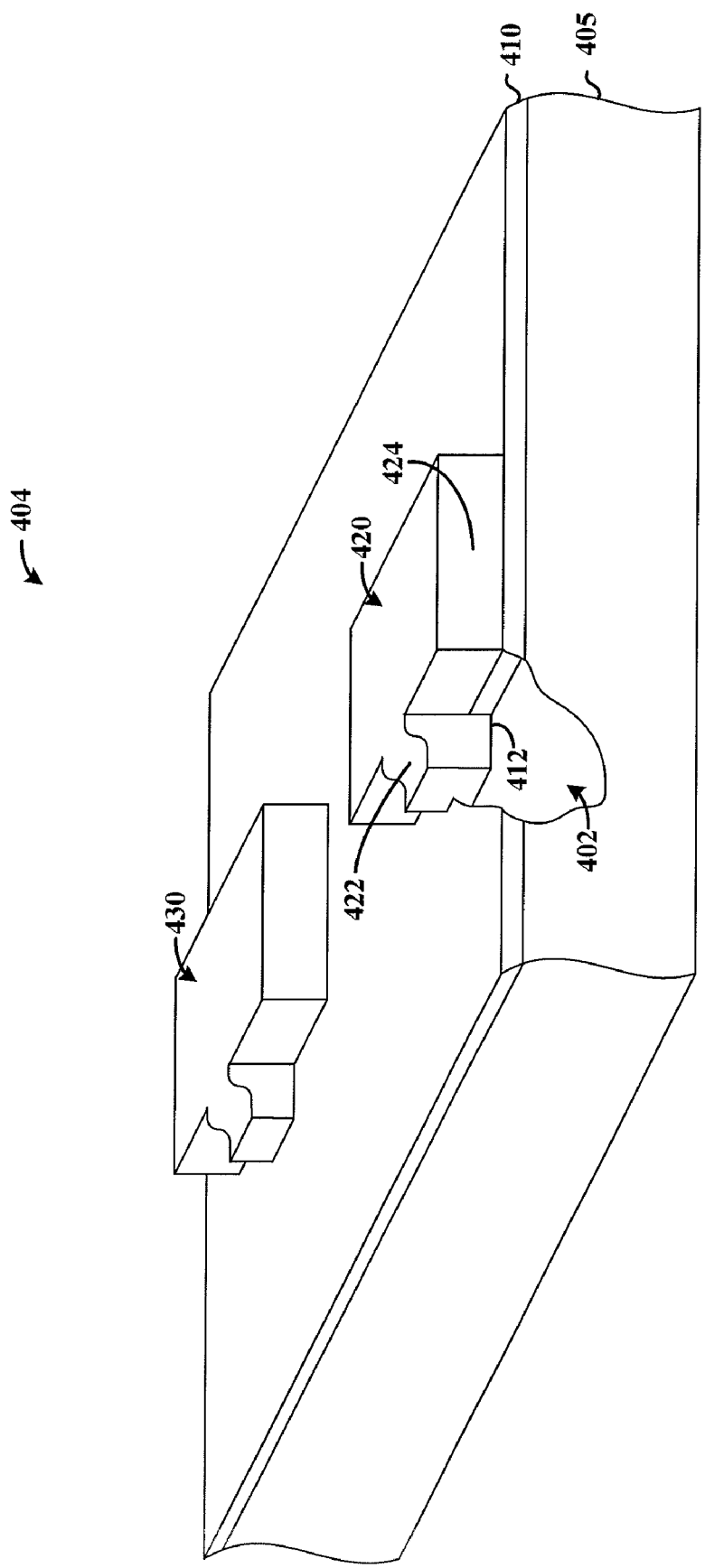
FIG. 4B is a cross-sectional, cut-out view of an array of GeOI semiconductor regions formed using a wafer similar to that shown in FIG. 4A, according to another example embodiment of the present invention.

FIG. 4B is a cross-sectional, cut-out view of a semiconductor device 404 having an array of GeOI semiconductor regions formed using a wafer similar to that shown in FIG. 4A, according to another example embodiment of the present invention. Two germanium-type devices 420 and 430 are shown having been formed using a crystallization approach similar to those discussed above, with seed locations such as shown in FIG. 4A used to initiate crystalline growth. The shape of the germanium-type devices 420 and 430 is controlled by an etching process used in forming germanium (prior to liquefying and crystallizing), with dimensions selected for the particular application in which the devices are to be applied. An upper inert-type layer (having been removed here in FIG. 4B) is used to change the direction of a crystalline growth front and facilitate the growth of substantially single-crystal germanium in a lateral direction of, e.g., 10 microns or more.

Using germanium device 420 as an example, an inert-type layer 410 is patterned over a silicon substrate 405 to form seed location 412 extending down through the inert-type layer and exposing the silicon substrate 405. The cut-out 402 shows a seeding portion 422 of the germanium device 420 over region 412 extending down through the inert-type layer 410 and interfacing with the silicon substrate 405. A crystalline growth propagates upward towards an upper surface of the germanium device 420 (bound by the inert layer prior to removal), where a change in direction of the growth front to a generally horizontal direction promotes single-crystal germanium growth in region 424. The array shown in the cross-sectional, cut-out view of device 404 is extended as desired for the particular implementation in which the device is used.

Figure 5:
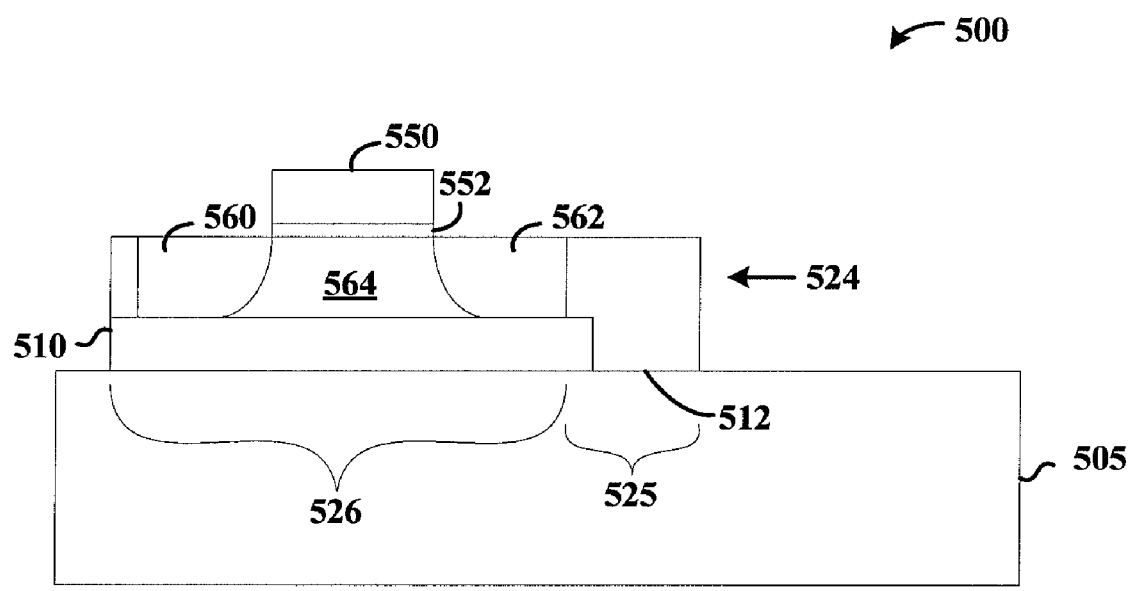
FIG. 5 shows an insulated gate field-effect transistor (IG-FET) having an epitaxially-grown germanium-based channel region in a GeOI structure, according to another example embodiment of the present invention.

As discussed above, the single-crystal germanium formed in connection with various example embodiments can be used in the formation of a variety of devices. FIG. 5 shows one such device 500 including an insulated gate field-effect transistor (IGFET) having an epitaxially-grown germanium-based active layer 524 in a GeOI structure, according to another example embodiment of the present invention. The IGFET-type device 500 includes an inert-type layer 510 over a bulk substrate 505 and the active germanium-based layer 524 on the inert-type layer. The active germanium-based layer 524 is grown using one or more of the above-discussed approaches, with patterning used to form the end device as shown. Growth of the active germanium-based layer 524 involves the initiation of crystallization at a seed location 512, with a first stage of crystalline growth in region 525 of the germanium-based layer extending upward. This first region 525 generally includes defects associated with a lattice mismatch at an interface between the germanium-based layer 524 and the bulk substrate 505 at the seed location 512. Upon a change in direction of growth to a generally horizontal direction in region 526 of the germanium-based layer 524, defects due to the lattice mismatch are substantially terminated. Continuing propagation of a crystalline front in the generally horizontal direction in region 526 forms substantially single-crystal germanium.

A gate dielectric layer 552 in the single-crystal germanium region 526 separates a channel region 564 from a gate electrode 550. Source/drain regions 560 and 562 are also in the single-crystal germanium region 526 and are electrically coupled in a current-passing mode when the channel region 564 is switched into a current-passing state via a signal applied to the gate electrode 550. In some implementations, portions of the active germanium-based layer 524 near the seed location 512 are removed.

In various other embodiments, one or more of the approaches and/or devices discussed herein are implemented in the formation and arrangement of a variety of other devices. In this regard, the following devices may be implemented in connection with one or more example embodiments discussed herein: FinFET devices; Ge, SiGe or GaAs bipolar junction transistors (BJTs) or heterostructure bipolar transistors (HBTs); RF (radio frequency) circuits; optical devices such as detectors and light emitting diodes (LEDs); virtual substrates amenable to growth of strained Si, strained Ge and/or strained SiGe (and associated devices), GaAs or other materials; three-dimensional integrated circuits and heterogeneous integration involving one or more of second level devices and circuits, including memory and logic, embedded circuits, matrix type memory and matrix-type circuits, optical latches and clocking devices integrated to silicon chips.

Figure 6:
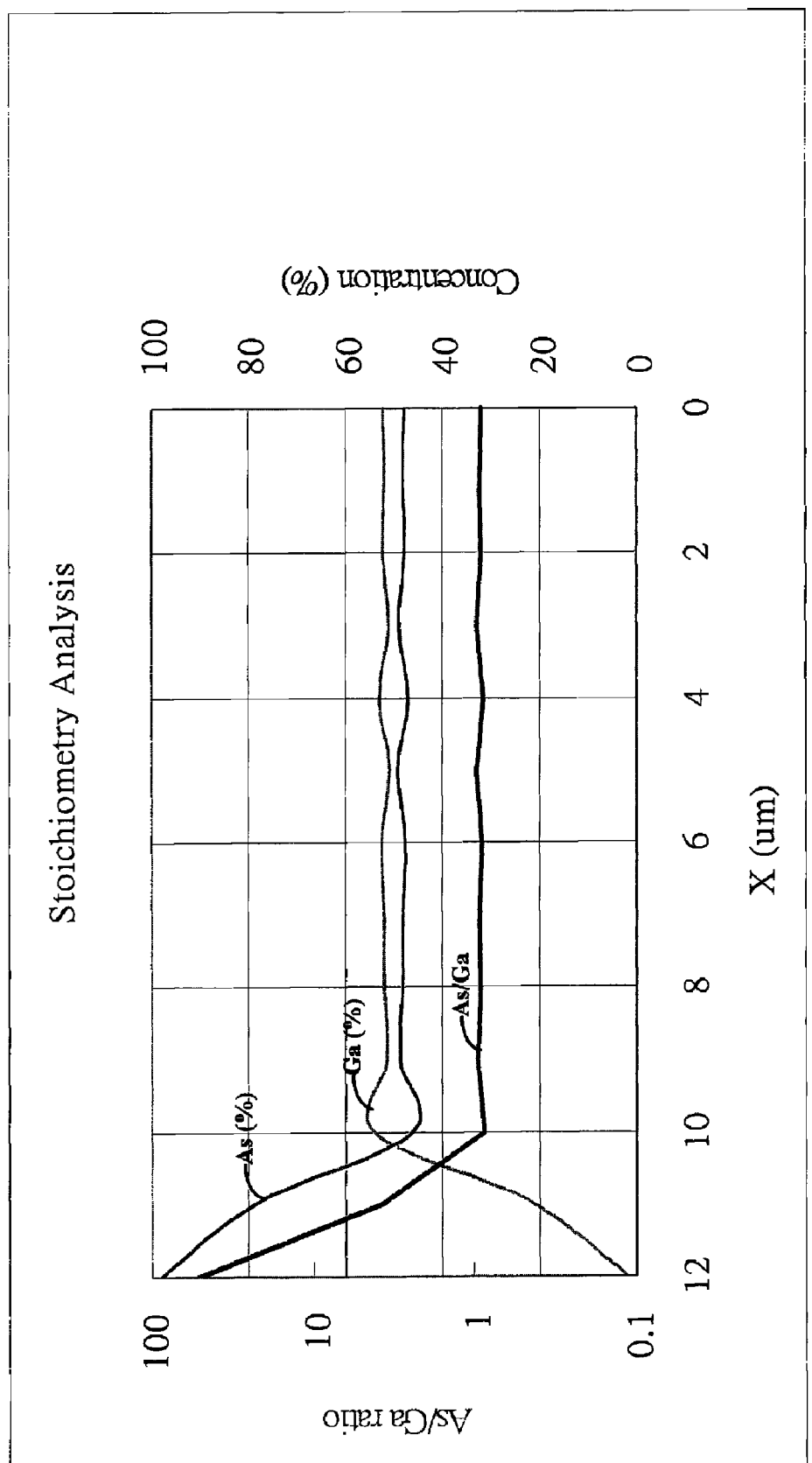
FIG. 6 depicts a graph of the stoichiometric analysis of GaAs, according to another example embodiment of the present invention.

Surprisingly, high quality crystalline GaAs on insulator on bulk Si substrates can be formed by simple deposition and heating using a micro-crucible melt regrowth technique. According to one embodiment, the technique includes deposition of an amorphous GaAs stripe that contacts a seed window in the silicon substrate. The deposited stripe is encapsulating with a deposited layer that acts as a micro-crucible. The deposited stripe is then melted to allow epitaxy to occur. Defects are terminated in the seed window and a single crystal GaAs stripe is created after solidification that is stoichiometric when measured by Energy Dispersive X-ray analysis. FIG. 6 depicts a graph of the stoichiometric analysis of GaAs.

The method leverages from those used in connection with liquid phase epitaxy of germanium on insulator (GOI), which can be used to build state-of-the-art Ge devices with $Al_2O_3$ high-K gate dielectrics in GOI formed by melt regrowth. An embodiment of the present invention is directed towards melt regrowth of silicon-on-insulator using laser heating. Laser heating can be especially useful when employing (compound) materials for which RTA melting is difficult or not possible.

Instead of behaving in an unpredictable manner (e.g., molten gallium and molten arsenic segregating unpredictably), the melt-regrow techniques work surprisingly well for compound semiconductors, such as GaAs. Based on a new thermodynamic understanding of the compound semiconductor phase diagrams, these techniques can be used for a variety of compounds. In particular, the techniques can be used for compounds that melt congruently (the solid exists in equilibrium with the liquid at the melting temperature). These techniques have a sound thermodynamic footing, as thermodynamics underlies the epitaxial growth process and controls the near-equilibrium phase transition that prevails at the liquid/solid interface. Because the group IV, III/V and II/VI compounds all melt congruently, these techniques can be used for a variety of compounds including, but not necessarily limited to, GaP, InP, InAs, InSb and GaSb, as has been demonstrated experimentally for GaAs. Indeed, the same thermodynamics underlies the ability to grow large boules of these compounds.

The ability to produce device quality layers of these materials with a simple technology on Si substrates, can be particularly useful for integrating compound semiconductor channel devices in a CMOS compatible technology. For example, producing InP layers on an Si substrate often required a very complex growth sequence having many different layers. Aspects of the present invention are particularly useful for a simple and effective method for producing InP (and other congruent melting compounds) layers on a Si substrate.

Figure 7:
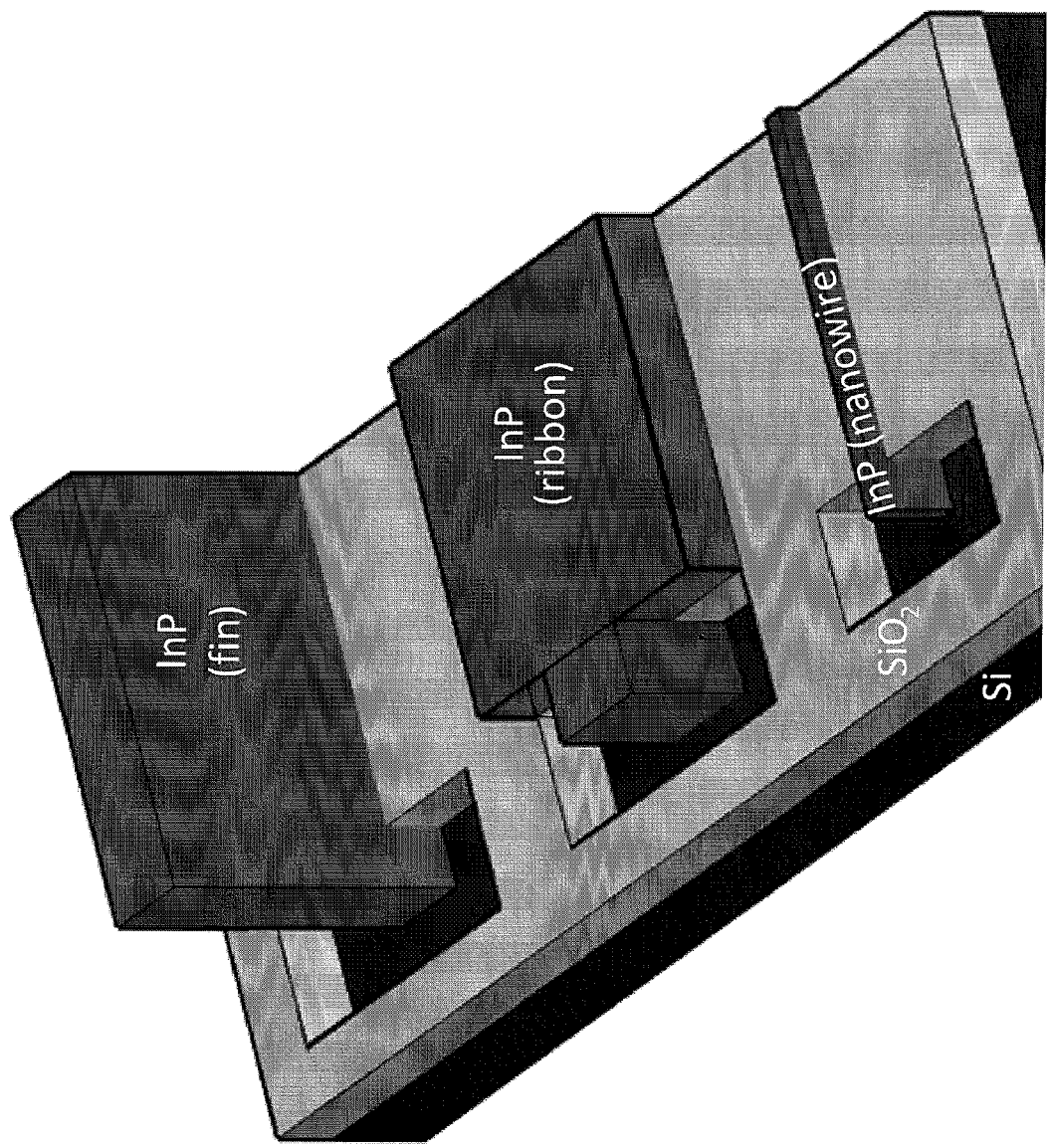
FIG. 7 depicts a few examples of how melt regrowth forms crystalline semiconductor islands on silicon wafers, according to another example embodiment of the present invention.

FIG. 7 shows an example melt regrowth of InP on insulator enabling crystalline layers with a fin, ultra-thin-body ribbon and nanowire configuration. Each of these structures is grown from a silicon wafer through a seed window. FIG. 7 depicts a few examples of how melt regrowth could form crystalline semiconductor islands on silicon wafers. Aspects of the present invention are not so limited and can be used to provide a simple and flexible way to produce a variety of layers and structures for different purposes.

Embodiments of the present invention involve the use the binary compounds on insulator as a crystalline template for vapor phase growth of the ternary or quaternary metastable alloys and superlattices of interest for high performance materials. Table 1 provides a nonexclusive list of some of the binary compounds that could be formed into crystalline layers on an insulating layer on a silicon wafer. Table 1 shows melting point, bandgap and lattice mismatch with silicon for several binary III/V compounds that could be grown using melt regrowth. Si, GaP and GaN compounds can form layers on a silicon substrate by laser melting, whereas the remaining compounds can form layers by RTA melting.

TABLE 1

| Material | Si | Ge | InSb | GaSb | InAs | AlSb | InP | GaAs | GaP | GaN |
|---|---|---|---|---|---|---|---|---|---|---|
| Melt Point (K) | 1685 | 1210 | 797 | 985 | 1215 | 1338 | 1343 | 1511 | 1739 | 2000 |
| Bandgap (eV) | 1.12 | 0.74 | 0.235 | 0.81 | 0.43 | 1.57 | 1.42 | 1.51 | 2.88 | 3.5 |
| % Mismatch | 0.0 | 4.0 | 19.7 | 12.5 | 11.7 | 12.9 | 8.3 | 4.0 | 0.04 | — |

While the present invention has been described with reference to several particular example embodiments, those skilled in the art will recognize that many changes may be made thereto without departing from the spirit and scope of the present invention, which is set forth in the following claims.

What is claimed is:

1. A method for manufacturing a semiconductor device using a first material that is substantially unreactive with a liquid-phase material, the method comprising:
    epitaxially growing a single-crystalline structure from the liquid-phase material;
    providing the first material with a physical orientation that directs the epitaxial growth of the single-crystalline structure; and
    mitigating defects in the epitaxially grown crystalline structure by using the first material.

2. The method of claim 1, wherein the liquid-phase material is a compound material that melts congruently.

3. The method of claim 1, wherein the liquid-phase material is a semiconductor including one of group IV, III-V and II-VI.

4. The method of claim 1, wherein the physical orientation of the unreactive material includes a passageway with a cross-sectional area that is sufficiently small to mitigate crystalline growth defects as a crystalline growth front of the liquid-phase material passes through the passageway.

5. The method of claim 1, wherein the physical orientation of the unreactive material necks the directed growth of the single-crystalline structure and wherein the single-crystalline structure is one of a nanowire, a ribbon and a fin.

6. The method of claim 1, wherein the physical orientation of the unreactive material is adapted to cause a crystalline growth front of the liquid-phase material to change direction.

7. The method of claim 1, further comprising:
    forming a layer of the unreactive material on a substrate amenable to seeding crystalline growth of the liquid-phase material;
    removing a portion of the unreactive material to expose a seed location on the substrate; and
    forming a solid-phase form of the liquid-phase material on the exposed substrate.

8. The method of claim 7, wherein forming a layer of the unreactive material includes forming a layer of insulative material, and further including growing single-crystalline structure on the insulative material.

9. The method of claim 7, wherein forming a solid-phase form of the liquid-phase material includes forming the solid-phase form of the liquid-phase material on the substantially unreactive material.

10. The method of claim 9, wherein the physical orientation of the unreactive material is used to mitigate defects due to a lattice mismatch between the liquid-phase material and another material immediately adjacent the liquid-phase material.

11. The method of claim 1, further comprising:
    forming a solid-phase material in contact with a seeding substrate;
    patterning the solid-phase material to form the physical orientation;
    liquefying the solid-phase material to form the liquid-phase material while substantially containing the liquid-phase material with the unreactive material; and
    initiating crystalline growth at an interface between the liquid-phase material and the seeding substrate.

12. The method of claim 11, wherein initiating crystalline growth comprises:
    growing the crystalline structure immediately adjacent the interface and permitting formation of lattice mismatch defects as a function of a crystalline lattice mismatch between the seeding substrate and the liquid-phase material; and
    using the substantially unreactive material to mitigate the lattice mismatch defects and continuing to grow the crystalline structure that is substantially free of the lattice mismatch defects.

13. The method of claim 1, further comprising the step of heating the liquid-phase material using laser heating.

14. A method for manufacturing a semiconductor device, the method comprising:
    introducing, to an inert-type material, a liquid-phase material that includes a compound of at least two materials; and
    epitaxially growing, from a substrate, a single-crystal from the liquid-phase material over the inert-type material and forming a semiconductor-on-insulator structure including the crystalline structure and the inert-type material.

15. The method of claim 14, wherein the liquid-phase material is a semiconductor including one of group IV, III-V and II-VI.

16. The method of claim 14, wherein introducing a liquid-phase material includes introducing the liquid-phase material to a silicon seed location and wherein epitaxially growing includes growing the crystalline structure from the silicon seed location.

17. The method of claim 14, wherein epitaxially growing includes heating the liquid-phase material using a laser.

18. The method of claim 14, wherein the compound is one of InSb, GaSb, InAs, AlSb, InP, GaAs, GaP and GaN.

19. The method of claim 16, further comprising:
    forming a layer of the inert-type material on a silicon substrate;

patterning an opening in the inert-type material and exposing the silicon substrate to form the silicon seed location; and wherein growing the crystalline structure from the silicon seed location includes growing the crystalline structure in a first direction upward from the silicon seed location and growing the single-crystalline structure over the inert-type material and in a lateral direction from the silicon seed location.

20. The method of claim 19, wherein patterning an opening in the inert-type material includes patterning an opening having a sufficient height-to-width ratio that causes a necking effect in the crystallization of the crystal structure growing upward from the silicon seed location, the necking effect causing lattice-mismatch defects to terminate upon the crystalline structure growth extending in the lateral direction.

21. The method of claim 14,
wherein introducing a liquid-phase material includes heating and liquefying the compound material while using the inert-type material to hold the liquid-phase material in place.

22. The method of claim 19, wherein fanning a semiconductor-on-insulator structure includes forming the semiconductor-on-insulator structure over a silicon-based substrate and adjacent to a silicon-based structure region employing a portion of the silicon-based substrate as an active region.

23. A method for manufacturing a semiconductor device including an inert-type material layer over a substrate, the method comprising:
patterning an opening in the inert-type material to expose a portion of the substrate and form a seed location for crystallizing a semiconductor at a bottom portion of the opening at the exposed substrate, the semiconductor including a compound of at least two materials;
forming a semiconductor-based material in the opening and over the inert-type material;
forming another inert-type material over the semiconductor-based material;
using the inert-type material to contain the semiconductor-based material, heating the semiconductor-based material and forming a liquid; and
cooling and crystallizing the semiconductor-based material, the crystallizing beginning at the seed location and crystallizing the liquid in a direction toward the inert-type material over the semiconductor-based material and using the inert-type material to cause a change in growth direction of the crystallization, such that the change in growth direction inhibits subsequent formation of crystalline defects and promotes subsequent crystallization of the liquid into a single-crystal semiconductor.

24. The method of claim 23, wherein the liquid is a semiconductor including one of groups IV, III-V and II-VI.

25. The method of claim 23, wherein the liquid is substantially GaAs.

26. The method of claim 23, wherein cooling and crystallizing the semiconductor-based material includes forming a semiconductor-based material that is substantially a single-crystal semiconductor.

27. The method of claim 23, wherein cooling and crystallizing the semiconductor-based material includes forming an interface between the semiconductor-based material and the inert-type material that is substantially free of defects associated with a lattice mismatch between the semiconductor and the exposed substrate.

28. The method of claim 23, wherein:
patterning an opening in the inert-type material includes patterning an opening extending from an upper surface of the inert-type material and down through the inert-type material to the substrate; and
cooling and crystallizing the semiconductor-based material includes crystallizing the semiconductor-based material with a growth front propagating in a first direction away from a lower portion of the opening where the semiconductor is adjacent the exposed substrate and subsequently crystallizing the semiconductor-based material with a growth front propagating in a second generally lateral direction.

* * * * *

UNITED STATES PATENT AND TRADEMARK OFFICE
CERTIFICATE OF CORRECTION

PATENT NO.        : 7,749,872 B2                                         Page 1 of 1
APPLICATION NO.   : 12/392261
DATED             : July 6, 2010
INVENTOR(S)       : Plummer et al.

It is certified that error appears in the above-identified patent and that said Letters Patent is hereby corrected as shown below:

In the Claims

Col. 17, line 22, Claim 22: "fanning a" should read --forming a--.

Signed and Sealed this

Second Day of November, 2010

David J. Kappos
*Director of the United States Patent and Trademark Office*